(12) United States Patent
Okura

(10) Patent No.: US 8,351,482 B2
(45) Date of Patent: Jan. 8, 2013

(54) MULTI-WAVELENGTH SEMICONDUCTOR LASER DEVICE

(75) Inventor: Yuji Okura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 85 days.

(21) Appl. No.: 12/779,068

(22) Filed: May 13, 2010

(65) Prior Publication Data

US 2010/0309661 A1    Dec. 9, 2010

(30) Foreign Application Priority Data

Jun. 9, 2009   (JP) ................................ 2009-138220

(51) Int. Cl.
  *H01S 3/08*   (2006.01)
(52) U.S. Cl. ............ 372/107; 372/36; 372/92; 257/666; 257/678; 257/680; 257/684; 257/686; 257/723; 257/732; 257/733
(58) Field of Classification Search .............. 372/92, 372/107, 36; 257/666, 678–733
  See application file for complete search history.

(56) References Cited

U.S. PATENT DOCUMENTS

| | | | | |
|---|---|---|---|---|
| 4,881,237 A | * | 11/1989 | Donnelly | 372/50.12 |
| 5,648,977 A | * | 7/1997 | Miyazaki | 372/36 |
| 5,668,822 A | * | 9/1997 | Tada | 372/36 |
| 5,828,683 A | | 10/1998 | Freitas | |
| 5,930,279 A | * | 7/1999 | Apollonov et al. | 372/50.12 |
| 6,151,342 A | | 11/2000 | Nightingale et al. | |
| 6,188,132 B1 | | 2/2001 | Shih et al. | |
| 7,236,366 B2 | * | 6/2007 | Chen | 361/709 |
| 7,376,166 B2 | * | 5/2008 | Hata et al. | 372/50.121 |
| 7,586,962 B1 | * | 9/2009 | Rotter et al. | 372/36 |
| 7,965,748 B2 | * | 6/2011 | Pu et al. | 372/36 |
| 2003/0165167 A1 | | 9/2003 | Ichikawa et al. | |
| 2005/0265413 A1 | | 12/2005 | Tsuda et al. | |
| 2007/0116070 A1 | | 5/2007 | Schulte et al. | |
| 2010/0265702 A1 | | 10/2010 | Abe | |

FOREIGN PATENT DOCUMENTS

| | | |
|---|---|---|
| EP | 0 803 949 A2 | 10/1997 |
| JP | 9-232677 A | 9/1997 |
| JP | 2004-22717 A | 1/2004 |
| JP | 2006-59471 A | 3/2006 |
| JP | 2007-311680 | 11/2007 |
| WO | WO 99/30394 A1 | 6/1999 |

OTHER PUBLICATIONS

Definition of groove Apr. 18, 2012 and p. 1.*
Definition of channel Apr. 18, 2012 and pp. 1-2.*
Great Britain Intellectual Property Office; Search Report in Great Britain Patent Application No. GB1112895.6 (Aug. 25, 2011).
Great Britain Intellectual Property Office; Examination Report in Great Britain Patent Application No. GB1112895.6 (Aug. 26, 2011).
State Intellectual Property Office of the People'S Republic of China; English language translation of First Office Action of Chinese Patent Application No. 2010101259119 (Jul. 22, 2011).
Great Britain Intellectual Property Office, International Search Report in Great Britain Patent Application 1107789.8 (May 25, 2011).

* cited by examiner

*Primary Examiner* — Armando Rodriguez
*Assistant Examiner* — Delma R Forde
(74) *Attorney, Agent, or Firm* — Leydig, Voit & Mayer, Ltd.

(57) ABSTRACT

A multi-wavelength semiconductor laser device includes a block having a rectangular groove with a bottom face and two side faces extending in a predetermined direction; and laser diodes with different light emission wavelengths mounted on the bottom face and the side faces of the groove in the block so that their laser beams are emitted in the predetermined direction.

11 Claims, 4 Drawing Sheets

MULTI-WAVELENGTH SEMICONDUCTOR LASER DEVICE

FIELD OF THE INVENTION

The present invention relates to a multi-wavelength semiconductor laser device that has a plurality of laser diodes for emitting different wavelength light beams.

BACKGROUND ART

An optical disc such as a compact disc (CD), a digital versatile disc (DVD), and a "Blu-ray Disc"™ (BD) has been increasingly used now as large capacity storage media. Laser diodes used for reading/writing from/to these discs have respective different emission wavelengths: a CD laser diode has an emission wavelength of 780 nm band (infrared), a DVD laser diode has an emission wavelength of 650 nm band (red), and a BD laser diode has an emission wavelength of 405 nm band (blue-violet). Hence, in order to treat data for a CD, a DVD, and a BD in a single optical disc drive, required are three light sources of infrared, red, and blue-violet.

In a case of configuring a multi-wavelength semiconductor laser device such that different wavelength laser-diode chips are arranged side by side, their emission points are spaced largely apart from each other, resulting in difficulty in optical design. For dealing therewith, there has been a conventional multi-wavelength semiconductor laser device, in which red and infrared laser diodes are arranged in parallel and bonded on a blue-violet laser diode that is mounted on a heat sink, to be able to treat data for CD, DVD, and BD in a single optical disc drive (see, for example, JP 2006-59471A).

In the multi-wavelength semiconductor laser device described in JP 2006-59471A, however, since the infrared and the red laser diodes are bonded on the blue-violet laser diode, there has been a problem in that heat generated during operation of the infrared and the red laser diodes cannot efficiently dissipate to the heat sink. Moreover, this configuration makes their assembly process complicated, resulting in a problem of high manufacturing costs.

SUMMARY OF THE INVENTION

The present invention is made to resolve such problems as mentioned above, and provides a multi-wavelength semiconductor laser device that has closely arranged laser-diode chips' emission points, and is easy in optical design and excellent in heat dissipation, as well as being easily manufactured.

A multi-wavelength semiconductor laser device according to a first aspect of the invention includes a block and a plurality of laser diodes whose emission wavelengths are different from each other, wherein the block is formed having a rectangular cross-section groove with a bottom face and two side faces extending in a predetermined direction, and the laser diodes are mounted on the bottom face and the side faces of the groove so that their laser beams emit in the predetermined direction.

A multi-wavelength semiconductor laser device according to a second aspect of the invention includes a block and a plurality of laser diodes whose emission wavelengths are different from each other, wherein the block is formed having a "V"-shape cross-section groove with two side faces extending in a predetermined direction, and the laser diodes are mounted on both side faces of the groove so that their laser beams emit in the predetermined direction.

A multi-wavelength semiconductor laser device according to a third aspect of the invention includes a block and a plurality of laser diodes whose emission wavelengths are different from each other, wherein the block is formed having a rectangular projection, and the laser diodes are mounted on a top face and side faces of the projection.

A multi-wavelength semiconductor laser device according to a fourth aspect of the invention includes a block and a plurality of laser diodes whose emission wavelengths are different from each other, wherein the block is formed having a flat face and a projection extending from the flat face, and the laser diodes are mounted on the flat face of the block and side faces of the projection.

According to the invention, a multi-wavelength semiconductor laser device can be realized that has closely arranged laser-diode chips' emission points, and is easy in optical design and excellent in heat dissipation, as well as being easily manufactured.

DESCRIPTION OF THE PREFERRED EMBODIMENTS

Embodiment 1

Figure 1:
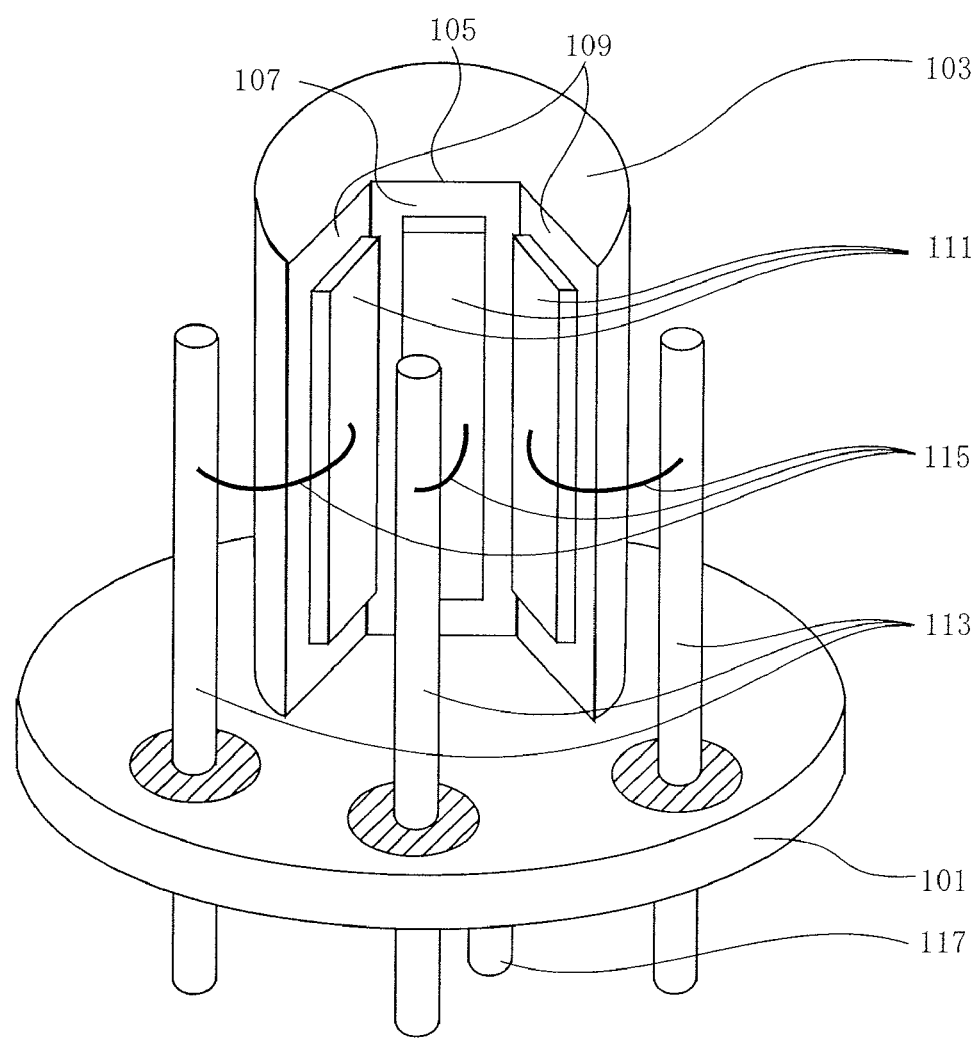
FIG. 1 is a schematic oblique perspective view of a configuration of a multi-wavelength semiconductor laser device according to Embodiment 1 of the present invention.
Figure 2:
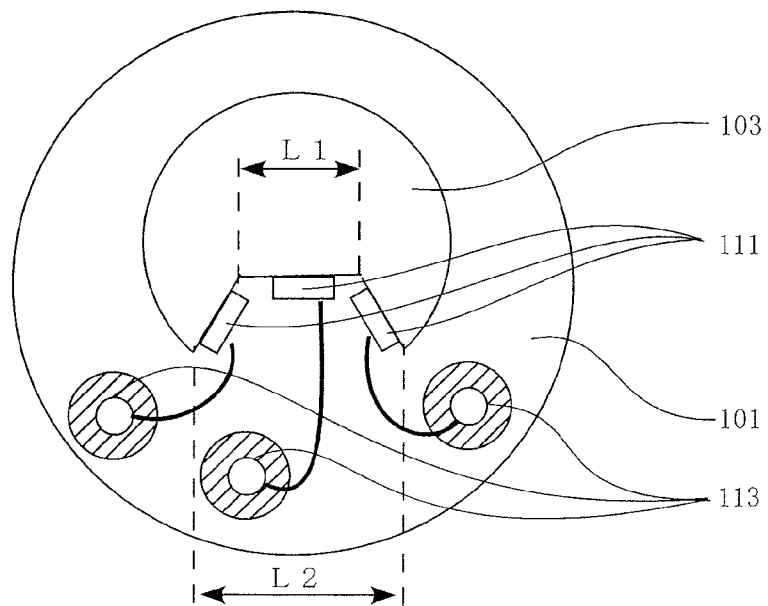
FIG. 2 is a schematic plan view of the configuration of the multi-wavelength semiconductor laser device of Embodiment 1.

FIG. 1 illustrates an oblique perspective view of a multi-wavelength semiconductor laser device according to Embodiment 1, and FIG. 2 illustrates its plan view. The multi-wavelength semiconductor laser device of this embodiment includes a stem 101 that is formed from a metal plate into a discoid shape; a cylindrical block 103 whose bottom face is placed on the top face of the stem 101; three laser diodes 111 that are mounted on a bottom face 107 and side faces 109 of a rectangular cross-section groove 105 formed laterally in the block 103; lead pins 113 that penetrate the stem 101; bonding wires 115 that connect the laser diodes 111 with the lead pins 113, respectively; and a ground pin 117 that is joined to the stem 101.

The block 103 is formed of a metal material having high thermal conductivity, such as a copper alloy, and the groove 105 formed laterally in the block 103 coincides in direction with emission directions (resonant directions) of the laser diodes 111 mounted on the bottom face 107 and the side faces 109 of the groove 105. The groove 105 in this embodiment expands in cross section toward its opening, i.e., the outermost width L2 of the opening is wider than the width L1 of the bottom face, thereby more facilitating die bonding and wire bonding of the laser diodes 111.

The three laser diodes 111 are respectively soldered to the bottom face 107 and the side faces 109 of the groove 105 formed in the block 103. Additionally, the laser diodes 111 may be mounted on these faces 107, 109 with submounts interposed therebetween. The laser diodes 111 are aligned so that their laser beams emit in parallel to the direction of the groove 105. Note that emission wavelengths of the three laser diodes 111 are a 780 nm band (infrared), a 650 nm band (red), and a 405 nm band (blue-violet), and there is no restriction on their mounting order.

The lead pins 113 are penetrated through the stem 101 with insulators each interposed therebetween and arranged near the respective laser diodes 111 mounted on the groove 105 of the block 103. Electrical connections are respectively made by the bonding wires 115 across the lead pins 113 and the p-side electrodes (not shown) of the laser diodes 111.

The ground pin 117 is welded to the stem 101 and electrically connected to the n-side electrodes (not shown) of the laser diodes 111 through the stem 101 and the block 103.

With the multi-wavelength semiconductor laser device thus configured, since the three laser diodes 111 are soldered to the block 103 directly or with submounts interposed therebetween, heat generated during operation of the laser diodes 111 can efficiently dissipate externally through the block 103.

Moreover, since the lead pins 113 are arranged near the respective laser diodes 111 mounted on the groove 105 of the block 103, wire bonding is facilitated across the lead pins 113 and the laser diodes 111, making easier the assembly process of the multi-wavelength semiconductor laser device compared to prior arts and thus reducing its manufacturing costs.

While, in this embodiment, the groove 105 formed in the block 103 has a shape such that its cross section expands toward the groove opening, the present invention is not limited to such a shape but may employ a groove 105 that has parallel side faces 109 opposite to each other, i.e., the widths L1 and L2 shown in FIG. 2 may have a relation of L1=L2, what is more, L1>L2. In particular, by forming a groove 105 in such a shape, as in this embodiment, that its cross section expands toward the groove opening (L1<L2), die bonding and wire bonding of the laser diodes 111 can be more easily performed.

Moreover, while the block 103 in this embodiment has a cylindrical shape with the groove 105 formed therein, the present invention is not limited to such a shape but may employ a block that has a cross section of a polygonal prism shape with such a groove formed therein.

Furthermore, while the block 103 formed separately from the stem 101 is placed thereon in this embodiment, the stem 101 and the block 103 may be formed in one piece by, for example, metal molding.

According to this embodiment, a multi-wavelength semiconductor laser device includes a block 103 and laser diodes 111 whose emission wavelengths are different from each other, wherein the block 103 has a rectangular cross-section groove 105 extending in a predetermined direction having a bottom face 107 and two side faces 109, and the laser diodes 111 are mounted on these faces 107, 109 so that their laser beams emit in the predetermined direction. Therefore, a multi-wavelength semiconductor laser device can be realized that has closely arranged emission points of the laser diodes 111, and is easy in optical design and excellent in heat dissipation, as well as being easily manufactured.

Embodiment 2

Figure 3:
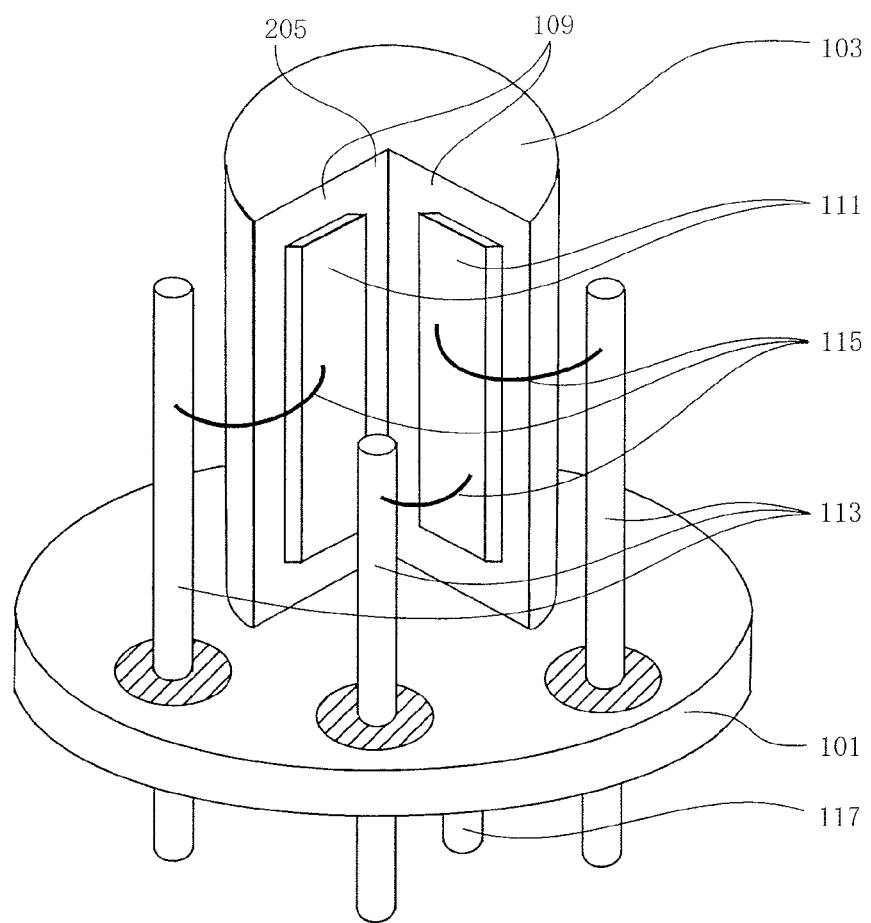
FIG. 3 is a schematic oblique perspective view of a configuration of a multi-wavelength semiconductor laser device according to Embodiment 2 of the invention.
Figure 4:
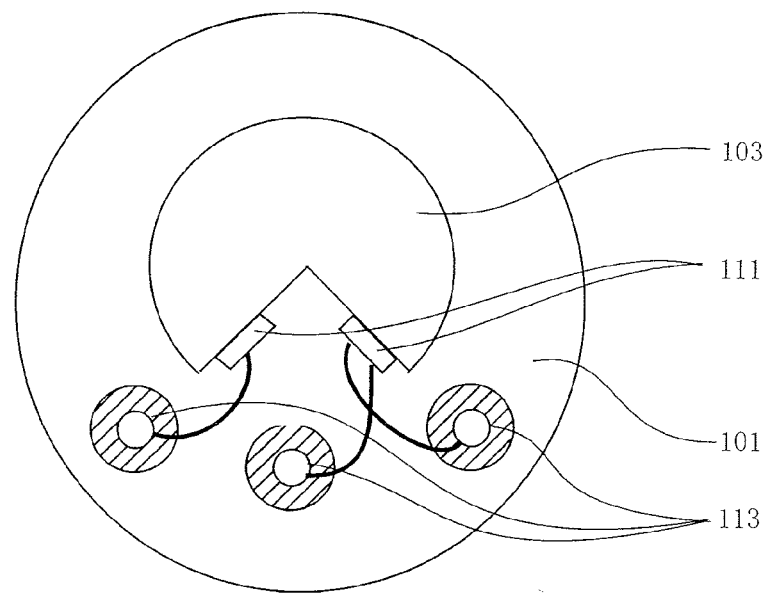
FIG. 4 is a schematic plan view of the configuration of the multi-wavelength semiconductor laser device of Embodiment 2.

FIG. 3 illustrates an oblique perspective view of a multi-wavelength semiconductor laser device in Embodiment 2 of the invention, and FIG. 4 illustrates its plan view. The multi-wavelength semiconductor laser device includes a two-wavelength laser diode as one of the plurality of laser diodes.

The multi-wavelength semiconductor laser device according to this embodiment includes a stem 101 that is formed from a metal plate into a discoid shape; a cylindrical block 103 whose bottom face is placed on the top face of the stem 101; two laser diodes 111 that are mounted on two side faces 209 of a "V"-shaped cross-section groove 205 formed laterally in the block 103; lead pins 113 that penetrate the stem 101; bonding wires 115 that connect the laser diodes 111 with the lead pins 113, respectively; and a ground pin 117 that is joined to the stem 101.

The block 103 is formed of a metal material having high thermal conductivity, such as a copper alloy, and the groove 105 formed laterally in the block 103 coincides in direction with resonant directions of the laser diodes 111 mounted on the two side faces 209. The groove 205 in Embodiment 2 has a "V" cross-sectional shape that expands toward its opening, thereby more facilitating die bonding and wire bonding of the laser diodes 111.

The two laser diodes 111 are soldered respectively to the two side faces 209 of the groove 205 formed in the block 103. Additionally, the laser diodes 111 may be mounted, as with Embodiment 1, on these faces 209 with submounts interposed therebetween. The laser diodes 111 are aligned so that their laser beams emit in parallel to the direction of the groove 205. One of the two laser diodes 111 is a two-wavelength laser diode that is capable of emitting laser beams having wavelengths of a 780 nm band (infrared) and a 650 nm band (red), and the other one is a blue-violet laser diode that has an emission wavelength of a 405 nm band (blue-violet). No restriction is imposed on their mounting order.

The lead pins 113 are penetrated through the stem 101 with insulators each interposed therebetween and arranged near the respective laser diodes 111 mounted on the groove 205 of the block 103. Electrical connections are respectively made by the bonding wires 115 across the lead pins 113 and the p-side electrodes of the laser diodes 111.

The ground pin 117 is welded to the stem 101 and electrically connected to the n-side electrodes (not shown) of the laser diodes 111 through the stem 101 and the block 103.

With the multi-wavelength semiconductor laser device thus configured, since the two laser diodes 111 are soldered to the block 103 directly or with submounts interposed therebetween, heat generated during operation of the laser diodes 111 can efficiently dissipate externally through the block 103.

Moreover, since the lead pins 113 are arranged near the respective laser diodes 111 mounted on the groove 205 of the block 103, wire bonding is facilitated across the lead pins 113 and the laser diodes 111, making easier the assembly process of the multi-wavelength semiconductor laser device compared to prior arts and thus reducing its manufacturing costs.

In particular, since the groove 205 formed in the block 103 has a "V" cross-sectional shape expanding toward its opening, it is possible to more easily perform die bonding and wire bonding of the laser diodes 111.

Moreover, while the block 103 in Embodiment 2 has a cylindrical shape with the groove 205 formed therein, the present invention is not limited to such a shape but may employ a block, as with Embodiment 1, that has a cross section of a polygonal prism shape with such a groove formed therein.

Furthermore, any of connecting locations of the three bonding wires 115 with the lead pins 113 and the lengths of the lead pins 113 may be altered individually as appropriate. These alterations allow more facilitating the wire bonding.

According to Embodiment 2, a multi-wavelength semiconductor laser device includes a block 103 and laser diodes 111 whose emission wavelengths are different from each other, wherein the block 103 has a "V"-shaped cross-section groove 205 formed therein in a predetermined direction with two side faces 209, and the laser diodes 111 are mounted on both side faces 209 so that their laser beams emit in the predetermined direction. Therefore, a multi-wavelength semiconductor laser device can be realized that has closely arranged emission points of the laser diodes 111, and is easy in optical design and excellent in heat dissipation, as well as being easily manufactured.

Embodiment 3

Figure 5:
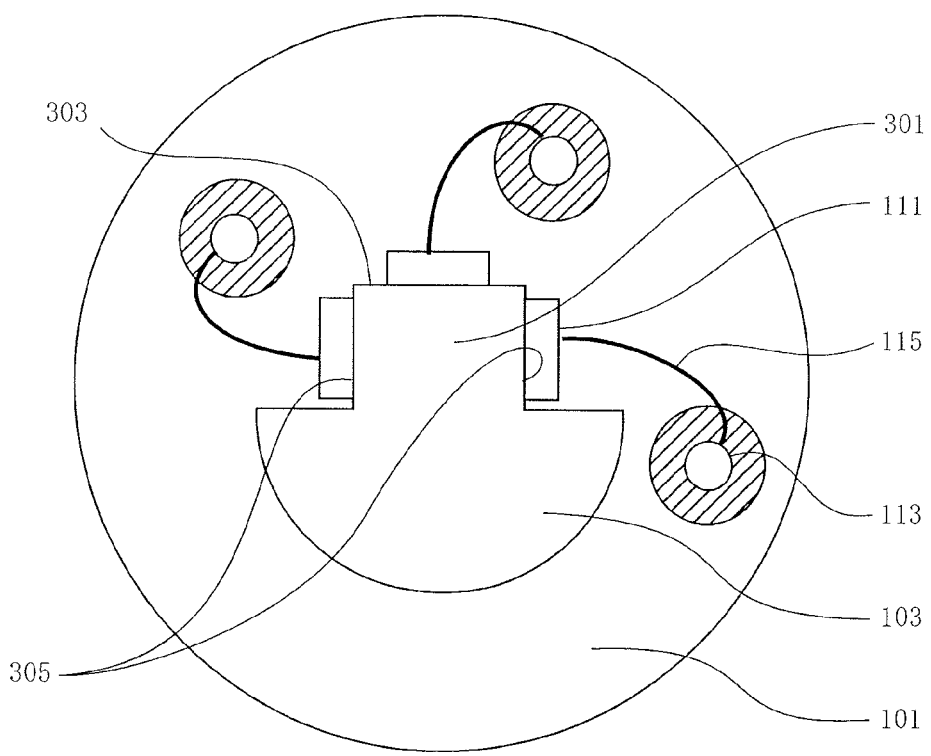
FIG. 5 is a schematic plan view of a configuration of a multi-wavelength semiconductor laser device according to Embodiment 3 of the invention.

FIG. 5 illustrates a plan view of a multi-wavelength semiconductor laser device in another embodiment of the invention. The multi-wavelength semiconductor laser device of Embodiment 3 includes a stem 101 that is formed from a metal plate into a discoid shape; a block 103 that has a rectangular projection 301 and whose bottom face is placed on the top face of the stem 101; and three laser diodes 111 that are mounted on a top face 303 and side faces 305 of the projection 301. Other configuration is the same as Embodiment 1.

The laser diodes 111, mounted on the top face 303 and the side faces 305 of the projection 301, are aligned so that their laser beams emit in the same direction. Additionally, the laser diodes 111 may be mounted, as with Embodiment 1, on these faces with submounts interposed therebetween.

With the multi-wavelength semiconductor laser device thus configured, since the three laser diodes 111 are soldered to the projection 301 directly or with submounts interposed therebetween, heat generated during operation of the laser diodes 111 can efficiently dissipate externally through the block 103.

According to Embodiment 3, a multi-wavelength semiconductor laser device includes a block 103 and laser diodes 111 whose emission wavelengths are different from each other, wherein the block 103 is formed having a rectangular projection 301, and the laser diodes 111 are mounted on the top face 303 and side faces 305 of the projection 301. Therefore, a multi-wavelength semiconductor laser device can be realized that has closely arranged emission points of the laser diodes 111, and is easy in optical design and excellent in heat dissipation, as well as being easily manufactured. Accordingly, such a multi-wavelength semiconductor laser device can also exhibit the same effect as Embodiment 1.

Embodiment 4

Figure 6:
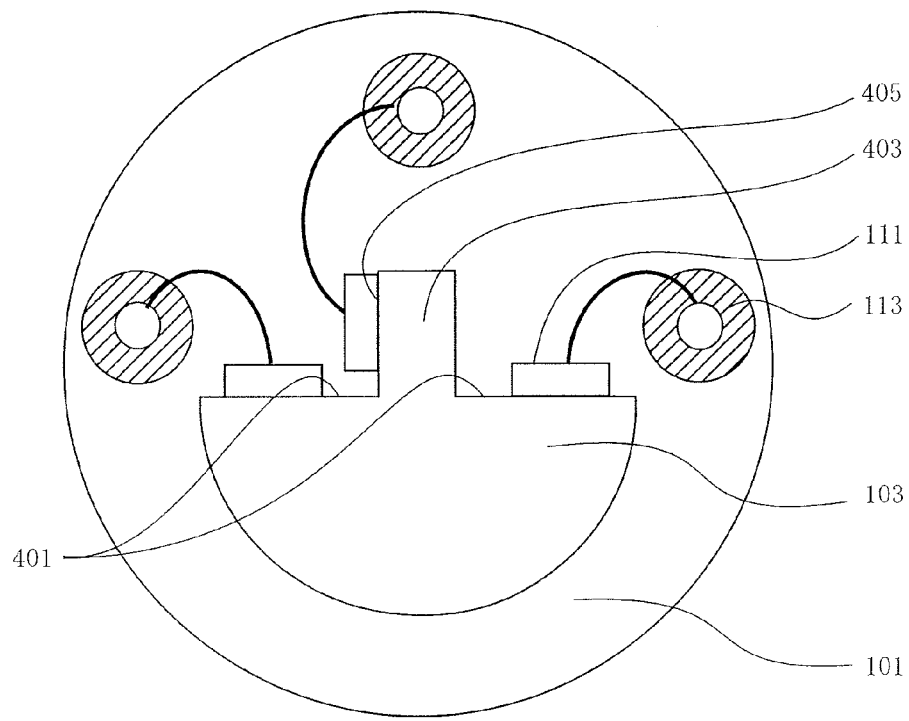
FIG. 6 is a schematic plan view of a configuration of a multi-wavelength semiconductor laser device according to Embodiment 4 of the invention.

FIG. 6 illustrates a plan view of a multi-wavelength semiconductor laser device in still another embodiment of the invention. The multi-wavelength semiconductor laser device of Embodiment 4 includes a stem 101 that is formed from a metal plate into a discoid shape; a block 103 whose bottom face is placed on the top face of the stem 101; and three laser diodes 111 that are mounted on a flat face 401 of the block 103 and side faces 405 of a projection 403 extending from the flat face 401. Other configuration is the same as Embodiment 1.

The laser diodes 111, mounted on the flat face 401 of the block 103 and the side faces 405 of the projection 403, are aligned so that their laser beams emit in the same direction. Additionally, the laser diodes 111 may be mounted, as with Embodiment 1, on these faces with submounts interposed therebetween.

With the multi-wavelength semiconductor laser device thus configured, since the three laser diodes 111 are soldered to the flat face 401 of the block 103 and the side faces 405 of the projection 403 directly or with submounts interposed therebetween, heat generated during operation of the laser diodes 111 can efficiently dissipate externally through the block 103.

According to Embodiment 4, a multi-wavelength semiconductor laser device includes a block 103 and laser diodes 111 whose emission wavelengths are different from each other, wherein the block 103 is formed having a flat face 401 and a projection 403 extending therefrom, and the laser diodes 111 are mounted on the flat face 401 and one of side faces 405 of the projection 403. Therefore, a multi-wavelength semiconductor laser device can be realized that has closely arranged emission points of the laser diodes 111, and is easier in optical design and excellent in heat dissipation, as well as being easily manufactured. Accordingly, such a multi-wavelength semiconductor laser device can also exhibit the same effect as Embodiment 1.

Embodiment 5

Figure 7:
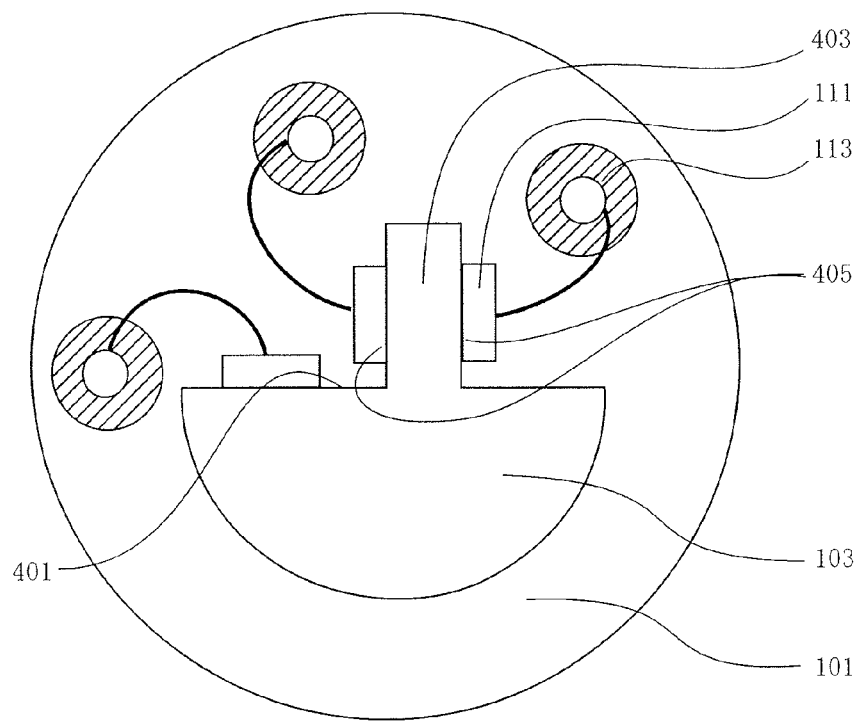
FIG. 7 is a schematic plan view of a configuration of a multi-wavelength semiconductor laser device according to Embodiment 5 of the invention.

FIG. 7 illustrates a plan view of a multi-wavelength semiconductor laser device in yet another embodiment of the invention. The multi-wavelength semiconductor laser device of Embodiment 5 includes a stem 101 that is formed from a metal plate into a discoid shape; a block 103 whose bottom face is placed on the top face of the stem 101; and three laser diodes 111 that are mounted on a flat face 401 of the block 103 and two side faces 405 of a projection 403 extending from the flat face 401. Other configuration is the same as that of Embodiment 1.

The laser diodes 111, mounted on the flat face 401 of the block 103 and the two side faces 405 of the projection 403, are aligned so that their laser beams emit in the same direction. Additionally, the laser diodes 111 may be mounted, as with Embodiment 1, on these faces with submounts interposed therebetween.

With the multi-wavelength semiconductor laser device thus configured, since the three laser diodes 111 are soldered to the flat face 401 of the block 103 and the two side faces 405 of the projection 403 directly or with submounts interposed therebetween, heat generated during operation of the laser diodes 111 can efficiently dissipate externally through the block 103.

According to Embodiment 5, a multi-wavelength semiconductor laser device includes a block 103 and laser diodes 111 whose emission wavelengths are different from each other, wherein the block 103 is formed having a flat face 401 and a projection 403 therefrom, and the laser diodes 111 are mounted on the flat face 401 and two side faces 405 of the projection 403. Therefore, a multi-wavelength semiconductor laser device can be realized that has closely arranged emission points of the laser diodes 111, and is easier in optical design and excellent in heat dissipation, as well as being easily manufactured. Accordingly, such a multi-wavelength semiconductor laser device can also exhibit the same effect as Embodiment 1.

Typical and preferable embodiments of the present invention have been disclosed in this specification and accompanying drawings. It should be noted that while specific terms are used in the specification, these terms are used only as general and descriptive meanings and not intended, as a matter of course, to limit the scopes of the claims set forth in the specification.

What is claimed is:

1. A multi-wavelength semiconductor laser device comprising: a block having a groove, the groove defining first, second, and third generally planar faces on the block, the second face being sandwiched by and contiguous to the first and third faces, wherein the groove includes an opening opposite the second face and the groove expands in cross section toward the opening; at least two laser diodes, each laser diode producing light at a respective emission wavelength, the respective wavelengths being different from each other; and a stem having a main surface on which the block is mounted, wherein the laser diodes are mounted on faces of the block in the groove so that each of the laser diodes emits light in a direction substantially perpendicular to the main surface of the stem.

2. The multi-wavelength semiconductor laser device of claim 1, including three laser diodes, wherein a laser diode is mounted on each of the first, second, and third faces of the block.

3. The multi-wavelength semiconductor laser device of claim 1, wherein each of the first and third faces forms an obtuse angle with the second face.

4. A multi-wavelength semiconductor laser device comprising: a cylindrical block having an external groove, the groove having first, second, and third generally planar external faces on the block, the second external face being sandwiched by and contiguous to the first and third external faces; at least two laser diodes, each laser diode producing light at a respective emission wavelength, the respective wavelengths being different from each other; and a stem having a main surface on which the cylindrical block is mounted, wherein the laser diodes are mounted on external faces of the first, second, and third external faces of the cylindrical block, in the external groove, so that each of the laser diodes emits light in a direction substantially perpendicular to the main surface of the stem.

5. The multi-wavelength semiconductor laser device of claim 4, wherein the external groove includes an opening opposite the second external face and the external groove expands in cross sectional area with increasing distance from the second external face, along a line transverse to the second external face.

6. The multi-wavelength semiconductor laser device of claim 4, including three laser diodes, wherein a respective one of the three laser diodes is mounted on each of the first, second, and third external faces of the cylindrical block.

7. The multi-wavelength semiconductor laser device of claim 4, wherein each of the first and third external faces forms an obtuse angle with the second external face.

8. A multi-wavelength semiconductor laser device comprising: a block having a groove including an opening, the groove defining first, second, and third generally planar faces on the block, the second face being sandwiched by and contiguous to the first and third faces and being opposite the opening, wherein volume of the block is larger than volume of the groove; at least two laser diodes, each laser diode producing light at a respective emission wavelength, the respective wavelengths being different from each other; and a stem having a main surface on which the block is mounted, wherein the laser diodes are mounted on faces of the block in the groove so that each of the laser diodes emits light in a direction substantially perpendicular to the main surface of the stem.

9. The multi-wavelength semiconductor laser device of claim 8, wherein the groove expands in cross sectional area with increasing distance from the second face, along a line transverse to the second face.

10. The multi-wavelength semiconductor laser device of claim 8, including three laser diodes, wherein a respective one of the three laser diodes is mounted on each of the first, second, and third faces of the block.

11. The multi-wavelength semiconductor laser device of claim 8, wherein each of the first and third faces forms an obtuse angle with the second face.

* * * * *